United States Patent
Cao et al.

(10) Patent No.: US 7,893,741 B2
(45) Date of Patent: Feb. 22, 2011

(54) MULTIPLE-STAGE, SIGNAL EDGE ALIGNMENT APPARATUS AND METHODS

(75) Inventors: Lipeng Cao, Austin, TX (US); Khoi B. Mai, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/483,392

(22) Filed: Jun. 12, 2009

(65) Prior Publication Data

US 2010/0315141 A1 Dec. 16, 2010

(51) Int. Cl.
*H03L 7/00* (2006.01)
(52) U.S. Cl. .......................... 327/161; 327/276; 327/284
(58) Field of Classification Search ................. None
See application file for complete search history.

(56) References Cited

U.S. PATENT DOCUMENTS

| | | | |
|---|---|---|---|
| 5,945,862 A | 8/1999 | Donnelly | |
| 5,963,074 A * | 10/1999 | Arkin | 327/276 |
| 5,994,938 A * | 11/1999 | Lesmeister | 327/277 |
| 6,330,197 B1 * | 12/2001 | Currin et al. | 365/194 |
| 6,795,931 B1 * | 9/2004 | LaBerge | 713/401 |
| 7,019,556 B2 | 3/2006 | Yoo | |
| 7,109,807 B2 * | 9/2006 | Lin | 331/25 |
| 7,263,154 B2 * | 8/2007 | Hsu et al. | 375/376 |
| 7,444,535 B2 | 10/2008 | Hsieh et al. | |
| 7,453,297 B1 * | 11/2008 | Kaviani | 327/161 |
| 7,459,930 B2 | 12/2008 | Mei | |
| 7,467,255 B2 | 12/2008 | Huang | |
| 7,642,831 B2 * | 1/2010 | Nguyen | 327/231 |
| 2003/0048113 A1 | 3/2003 | Haycock et al. | |
| 2005/0047192 A1 | 3/2005 | Matsui et al. | |
| 2007/0058479 A1 | 3/2007 | Matsui | |
| 2007/0097781 A1 | 5/2007 | Li et al. | |
| 2008/0120457 A1 | 5/2008 | Gillingham et al. | |
| 2009/0206875 A1 | 8/2009 | Tran et al. | |

OTHER PUBLICATIONS

Yoo, C., et al., Open-loop full-digital duty cycle correction circuit, Electronics Letters vol. 41 No. 11, May 26, 2005.

* cited by examiner

*Primary Examiner*—Cassandra Cox
(74) *Attorney, Agent, or Firm*—Ingrassia, Fisher & Lorenz, P.C.

(57) ABSTRACT

Signal edge alignment embodiments include multiple delay stages connected in series. Each delay stage includes a delay line, an interface circuit, and a tap selection circuit. The delay line applies fixed-width delays to an input signal to produce delayed versions of the input signal at a plurality of taps. The interface circuit, which is characterized by an inherent interface circuit delay, passes one of the delayed versions to an interface circuit output in response to a control signal. The tap selection circuit determines a finally-identified tap of the plurality of taps by determining an initially-identified tap at which a delayed version of the input signal most closely has a desired alignment with the input signal, and by identifying the finally-identified tap in the control signal as a tap that occurs earlier in the delay line than the initially-identified tap. This compensates for the inherent delay of the delay stage.

23 Claims, 7 Drawing Sheets

MULTIPLE-STAGE, SIGNAL EDGE ALIGNMENT APPARATUS AND METHODS

RELATED APPLICATION

This application is related to U.S. patent application Ser. No. 12/483,386, entitled "MEMORY CONTROLLER CALIBRATION", and filed on an even date herewith.

TECHNICAL FIELD

Embodiments relate to methods and apparatus for aligning the edges (e.g., high-to-low and low-to-high transitions) of multiple signals.

BACKGROUND

Various types of electronic systems include circuitry adapted to align transitions (or "edges") of a first signal with transitions of a second signal. In some cases, the second signal may be a delayed version of the first signal, and edge alignment may be performed in order to align rising edges of the first signal with falling edges of the second signal, or vice versa. These types of alignment procedures may be useful, for example, to provide alignment information for other circuitry that is designed to measure signal characteristics and/or to perform signal correction, filtering or other procedures.

Some edge alignment circuits include a delay line with a plurality of series-connected delay elements. Each element in the delay line may impart a fixed-width delay, d, to the signal that it receives. Accordingly, the cumulative delay applied to a signal at the output of the $n^{th}$ delay element equals d×n (n= 1 ... N), where N is the number of series-connected delay elements in the delay line.

An edge-alignment circuit that includes delay elements with relatively small, fixed-width delays (a "high resolution, edge-alignment circuit") may provide better edge alignment resolution (or accuracy) than an edge-alignment circuit that includes delay elements with relatively large, fixed-width delays (a "coarse resolution, edge-alignment circuit"). However, given a same number of delay elements, a high resolution, edge-alignment circuit may perform edge alignment for signals in a narrower frequency range than is possible using a coarse resolution, edge-alignment circuit. Accordingly, in a device in which process-voltage-temperature (PVT) ranges or other factors necessitate edge alignment over a relatively wide frequency range, a coarse resolution, edge-alignment circuit may be a preferable design choice, although at the sacrifice of more accurate edge alignment resolution. Conversely, in a device in which accurate edge alignment resolution is a more important design requirement, a high resolution, edge-alignment circuit may be a preferable design choice, although at the potential sacrifice of performance over the entire range of PVT variations.

Current edge alignment circuits are capable of providing either relatively high resolution edge alignment or edge alignment over a relatively wide frequency range, but not both. This means that circuit designers must decide whether to sacrifice either edge alignment accuracy or frequency range. However, in some cases both highly accurate edge alignment and wide operable frequency ranges are desirable. Accordingly, what are needed are edge alignment apparatus that are capable of providing relatively high resolution edge alignment for signals over a relatively wide frequency range and across a wide range of PVT variations.

DETAILED DESCRIPTION

Embodiments include methods and apparatus for aligning the edges of multiple signals. More particularly, embodiments include methods and apparatus for aligning the edges of multiple signals using edge alignment apparatus that includes multiple delay stages. The various embodiments may provide one or more advantages over traditional edge alignment methods and apparatus. For example, embodiments may be capable of providing relatively high resolution edge alignment for signals over a relatively wide frequency range and across a wide range of PVT variations, when compared with current edge alignment methods and apparatus.

Figure 1:
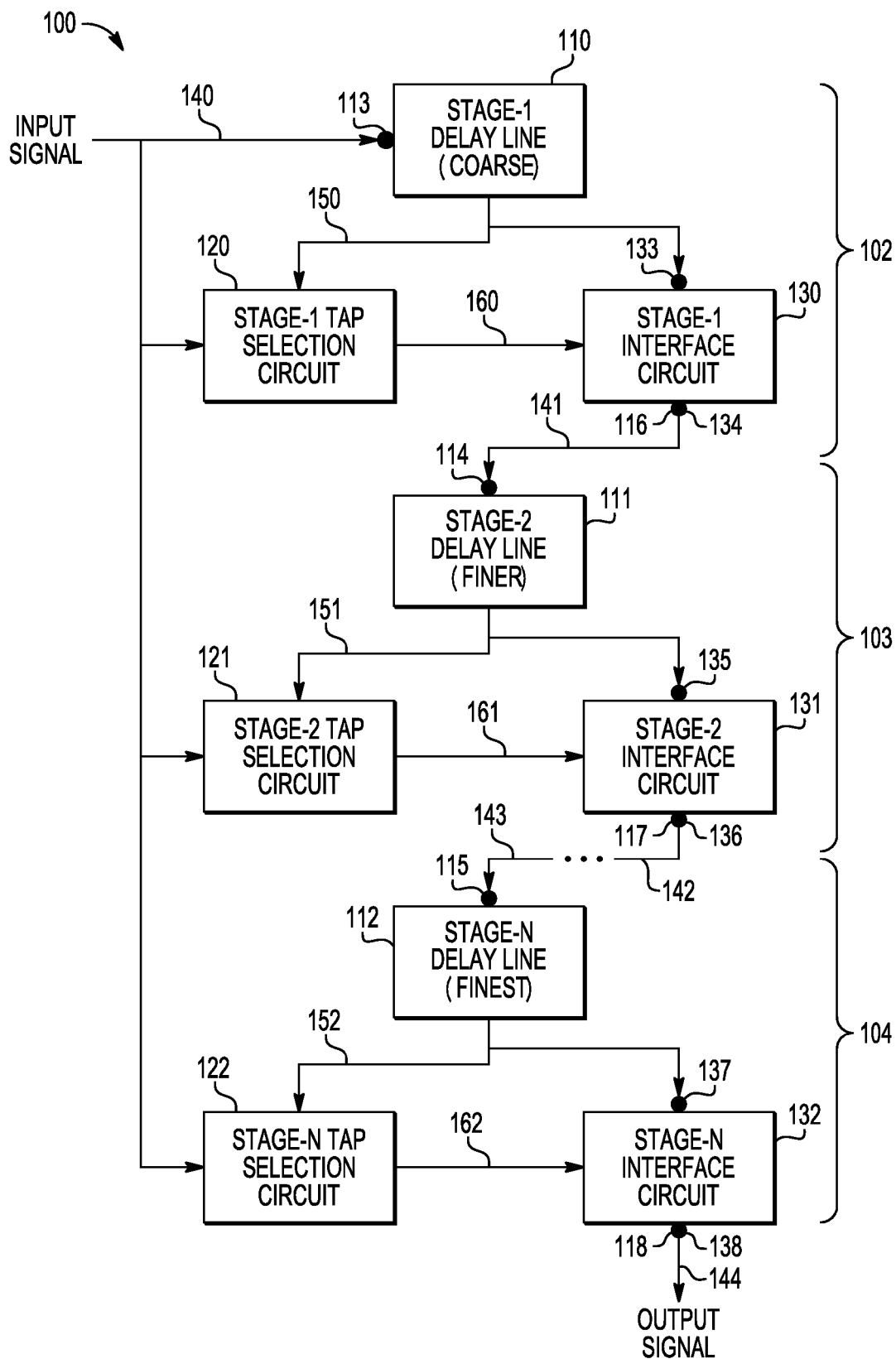
FIG. 1 illustrates a simplified block diagram of a multiple-stage edge alignment circuit, according to an example embodiment.

FIG. 1 illustrates a simplified block diagram of a multiple-stage edge alignment circuit 100, according to an example embodiment. Edge alignment circuit 100 includes a number, N, of delay stages 102, 103, 104, where N may be any integer between 2 and 5, according to an embodiment. In other embodiments, N may be greater than 5. Although only three stages 102-104 are illustrated in FIG. 1, it is to be understood that edge alignment circuits may have as few as two stages or more than three stages, in various embodiments. The illustrated stages 102-104 are referred to herein as "stage-1" 102, "stage-2" 103, and "stage-N" 104.

Each stage 102-104 includes a delay stage input 113, 114, 115, a delay stage output 116, 117, 118, a delay line 110, 111, 112, a tap selection circuit 120, 121, 122, and an interface circuit 130, 131, 132. According to an embodiment, an input signal 140 (e.g., a clock signal or other type of signal) is received at a delay stage input 113 of stage-1 102. More particularly, the input signal 140 is received by stage-1 delay line 110. Stage-1 delay line 110 includes a plurality of series-connected delay elements (not illustrated in FIG. 1), each of which applies a fixed-width delay, d1, having a first resolution or width. The sequential application of the fixed-width delays results in a plurality of delay line output signals 150 accessible at an output node (or "tap") following each delay element.

The delay line output signals 150 are received at inputs to stage-1 tap selection circuit 120 and stage-1 interface circuit 130, as shown in FIG. 1. Stage-1 tap selection circuit 120 also receives input signal 140, and stage-1 tap selection circuit 120 is adapted to determine which of the delay line output signals 150 most closely corresponds to a signal having a desired alignment with input signal 140. For example, stage-1 tap selection circuit 120 may be adapted to determine which of the delay line output signals 150 has rising edges (i.e., low-to-high transitions) that most closely align with falling edges (i.e., high-to-low transitions) of the input signal 140, according to an embodiment. Alternatively, as another example, stage-1 tap selection circuit 120 may be adapted to determine which of the delay line output signals 150 has falling edges that most closely align with rising edges of the input signal 140, according to an embodiment. Stage-1 tap selection circuit 120 may identify a particular delay line output signal 150 based on some other criteria of alignment with input signal 140, in other embodiments. As used herein, the term "target edges for alignment" refers to the type of edge of the input signal 140 and the type of edge of the delay line output signals 150 that are being aligned. For example, in the former embodiment described above, the target edges for alignment include the falling edges of the input signal 140 and the rising edges of the delay line output signals 150. In contrast, in the latter embodiment described above, the target edges for alignment include the rising edges of the input signal 140 and the falling edges of the delay line output signals 150

The identification of a delay line output signal 150 having a desired alignment with input signal 140 may be made, for example, by comparing and/or correlating input signal 140 (or an inverted or otherwise processed version thereof) with each of the delay line output signals 150. The "initially-identified" delay line output signal 150 includes the output signal 150 that is closest to having the desired alignment, according to an embodiment. An identifier of the tap associated with the initially-identified delay line output signal 150 may be considered to be an "initially-identified" tap. The initially-identified tap may be represented by a number, for example, that indicates which tap corresponds with the initially-identified delay line output signal 150.

According to an embodiment, stage-1 tap selection circuit 120 also performs a tap selection adjustment procedure to determine a "finally-identified" delay line output signal 150. This determination is made based on the length of an "inherent delay" associated with stage-1 102. As used herein, the term "inherent delay," as it relates to any stage (e.g., stage-1 102 or stage-2 103) other than a final stage (e.g., stage-N 104), includes: 1) an "inherent interface circuit delay" between an input (e.g., input 133) and an output (e.g., output 134) of that stage's interface circuit (e.g., stage-1 interface circuit 130); 2) any "inherent start up delay" of a next stage (e.g., stage-2 103); and 3) any "intentional delay adjustment" applied (in either direction) to ensure that a subsequent stage is able to delay the signal to a finer alignment resolution. Regarding the "inherent start up delay," for delay lines having certain designs, the delay applied between the input to the delay line and the output of the first delay element (e.g., the tap associated with the first delay element's output) may be significantly larger than the delay applied by any subsequent delay element in the delay line. The difference between the apparent delay applied by the first delay element (e.g., the delay between the delay line's input and the output of the first delay element) and the actual delay applied by a subsequent delay element is referred to herein as the inherent start up delay of the delay line. In addition, regarding the "intentional delay adjustment" applied by a delay line, the finally-identified tap of any stage (e.g., stage-1 102 or stage-2 103) other than a final stage (e.g., stage-N 104) is selected to ensure that enough of a time difference is present between the target edges for alignment (e.g., alignment error 322, FIG. 3, described later) to allow any subsequent delay stage to further delay its respective input signal to a finer alignment resolution. In contrast with preceding stages, the "inherent delay" of the final stage (e.g., stage-N 104) includes only the delay between the input (e.g., input 137) and the output (e.g., output 138) of that stage's interface circuit (e.g., stage-N interface circuit 132).

According to an embodiment, stage-1 tap selection circuit 120 may select the finally-identified delay line output signal 150 to be a signal 150 having a smaller delay, when compared with the delay of the initially-identified delay line output signal 150. The difference between the first delay associated with the initially-identified delay line output signal 150 and the finally-identified delay line output signal 150 is related to the inherent delay associated with stage-1 102, according to an embodiment. An identifier of the tap associated with the finally-identified delay line output signal 150 may be considered to be a "finally-identified" tap.

Once the finally-identified delay line output signal 150 has been determined, the stage-1 tap selection circuit 120 provides a control signal 160 to the stage-1 interface circuit 130, which indicates the finally-identified tap. Stage-1 interface circuit 130 is adapted to receive the delay line output signals 150, and to allow only one of the delay line output signals 150 to be output (at the delay stage output 116) as the stage-1 output signal 141. According to an embodiment, the delay line output signal 150 that is output as the stage-1 output signal 141 corresponds to the delay line output signal 150 corresponding to the finally-identified tap indicated in control signal 160. Accordingly, provision of the control signal 160 causes the stage-1 interface circuit 130 to pass the delay line output signal 150 corresponding to the finally-identified tap to the delay stage output 116.

As discussed above, stage-1 102 has an associated inherent delay. Because the inherent delay roughly equals the delay differential between the initially-identified and finally-identified delay line output signals 150, the stage-1 output signal 141 should more closely align with the input signal 140 in the desired manner than it would if the inherent delay of stage-1 102 were left uncompensated for. This characteristic of the various embodiments makes it possible for the multiple-stage edge alignment circuit 100 to produce highly accurate alignment, despite the inherent delays associated with the stages.

Continuing through the remainder of circuit 100, the stage-1 output signal 141 is received by a delay stage input 114 of stage-2 103. More particularly, the stage-1 output signal 141 is received by stage-2 delay line 111. Stage-2 delay line 111 is similar in configuration to stage-1 delay line 110, in that stage-2 delay line 111 includes a plurality of series-connected delay elements, each of which applies a fixed-width delay, d2, which has a second resolution or width. According to an embodiment, the resolution of the delay elements of the stage-2 delay line 111 is finer than the resolution of the delay elements of the stage-1 delay line 110. In other words, the length of delay, d1, of the delay elements of the stage-1 delay line 110 is longer than the length of delay, d2, of the delay elements of the stage-2 delay line 111. According to an embodiment the fixed-width delay, d2, is less than fifty percent of the fixed-width delay, d1. According to another embodiment the fixed-width delay, d2, is less than ten percent of the fixed-width delay, d1. In stage-2 delay line 111, the sequential application of the fixed-width delays results in a plurality of delay line output signals 151 accessible at a tap at the output of each delay element. According to an embodiment, in order to achieve the smaller delay, d2, stage-2 delay line 111 may have a different circuit structure (e.g., phase interpolation) from the stage-1 delay line 110. As discussed previously, the inherent start up delay for stage-2 delay line 111 is compensated for by stage-1 tap selection circuit 120 in the selection of the finally-identified tap of the stage-1 delay line 110.

The delay line output signals 151 are received at inputs to stage-2 tap selection circuit 121 and stage-2 interface circuit 131, as shown in FIG. 1. Stage-2 tap selection circuit 121 also receives input signal 140. In a substantially similar manner as the stage-1 tap selection circuit 120, the stage-2 tap selection circuit 121 is adapted to determine which of the delay line output signals 151 most closely corresponds to a signal having the desired alignment with input signal 140. The determination results in an initially-identified delay line output signal 151.

In a substantially similar manner as the stage-1 tap selection circuit 120, stage-2 tap selection circuit 121 also performs a tap selection adjustment procedure to determine a finally-identified delay line output signal 151, according to an embodiment. This determination is made based on the length of an inherent delay associated with stage-2 103. Once the finally-identified delay line output signal 151 has been determined, the stage-2 tap selection circuit 121 provides a control signal 161 to the stage-2 interface circuit 131, which indicates the finally-identified tap. Stage-2 interface circuit 131 is adapted to receive the delay line output signals 151 at an input 135, and to allow only one of the delay line output signals 151 to be output (at the stage-2 interface circuit output 136, which is also the delay stage output 117) as the stage-2 output signal 142. According to an embodiment, the delay line output signal 151 that is output as the stage-2 output signal 142 corresponds to the delay line output signal 151 corresponding to the finally-identified tap indicated in control signal 161.

Between stage-2 103 and stage-N 104, zero or more intervening stages may be present. Each intervening stage may be adapted to function substantially similarly to preceding stages, except that the resolution of any given stage is relatively fine, when compared with the resolutions of preceding stages. In other words, the delay elements of a particular stage are adapted to apply relatively shorter, fixed-width delays than are the delay elements of any preceding stage. This characteristic of the various embodiments enables edge alignment to be performed to any level of accuracy, where more accuracy may be achieved using more stages.

Eventually, the output signal 143 from the immediately preceding stage (e.g., stage 2 104 or an intervening stage, not illustrated) is received by a delay stage input 115 of stage-N 104. More particularly, the output signal 143 is received by stage-N delay line 112. Stage-N delay line 112 is similar in configuration to stage-1 delay line 110, in that stage-N delay line 112 includes a plurality of series-connected delay elements, each of which applies a fixed-width delay, dN. However, as indicated above, the resolution of the delay elements of the stage-N delay line 112 is finer than the resolution of the delay elements of the stage-2 delay line 111 or any other intervening delay lines (not illustrated). In stage-N delay line 112, the sequential application of the fixed-width delays results in a plurality of delay line output signals 152 accessible at a tap at the output of each delay element. As discussed previously, the inherent start up delay for stage-N delay line 112 is compensated for by the tap selection circuit of the immediately preceding stage (e.g., stage-2 tap selection circuit 121, if no stages are intervening) in its selection of the finally-identified tap of the delay line of the immediately preceding stage (e.g., stage-2 delay line 111, if no stages are intervening).

The delay line output signals 152 are received at inputs to stage-N tap selection circuit 122 and stage-N interface circuit 132, as shown in FIG. 1. Stage-N tap selection circuit 122 also receives input signal 140. In a substantially similar manner as the stage-1 tap selection circuit 120, the stage-N tap selection circuit 122 is adapted to determine which of the delay line output signals 152 most closely corresponds to a signal having the desired alignment with input signal 140. The determination results in an initially-identified delay line output signal 152.

In a substantially similar manner as the stage-1 tap selection circuit 120, stage-N tap selection circuit 122 also performs a tap selection adjustment procedure to determine a finally-identified delay line output signal 152, according to an embodiment. This determination is made based on the length of an inherent delay between an input 137 and an output 138 of stage-N interface circuit 132. However, in contrast with preceding stages (e.g., stage-1 102 and stage-2 103), the inherent delay of stage-N 104 includes only the delay between the input 137 and the output 138 of the stage-N interface circuit 132 (e.g., because there is no next stage, the inherent delay does not include any inherent start up delay of any next stage). In addition, the finally-identified tap of stage-N 104 does not need to be selected to ensure that a time difference is present between the target edges for alignment, since stage-N 104 corresponds to the final and finest alignment resolution.

Once the finally-identified delay line output signal 152 has been determined, the stage-N tap selection circuit 122 provides a control signal 162 to the stage-N interface circuit 132, which indicates the finally-identified tap. Stage-N interface circuit 132 is adapted to receive the delay line output signals 152, and to allow only one of the delay line output signals 152 to be output (at the delay stage output 118) as the stage-N output signal 144. According to an embodiment, the delay line output signal 152 that is output as the stage-N output signal 144 corresponds to the delay line output signal 152 corresponding to the finally-identified tap indicated in control signal 162. The delay line output signal 152 that is output by stage-N interface circuit 132 corresponds to the ultimate output signal 144 of the edge alignment circuit 100.

As the above description indicates, the first stage (e.g., stage-1 102) within a multiple-stage edge alignment circuit (e.g., circuit 100) produces an output signal (e.g., output signal 141) that is relatively coarsely aligned with the input signal (e.g., input signal 140), according to an embodiment. Any subsequent stages (e.g., stage-2 103 and stage-N 104) produce output signals (e.g., output signals 142, 144) that are relatively more finely aligned (i.e., more accurately aligned) with the input signal, where the output signal of the final stage (e.g., output signal 144) is the most finely aligned (i.e., the most accurately aligned) with the input signal.

Figure 2:
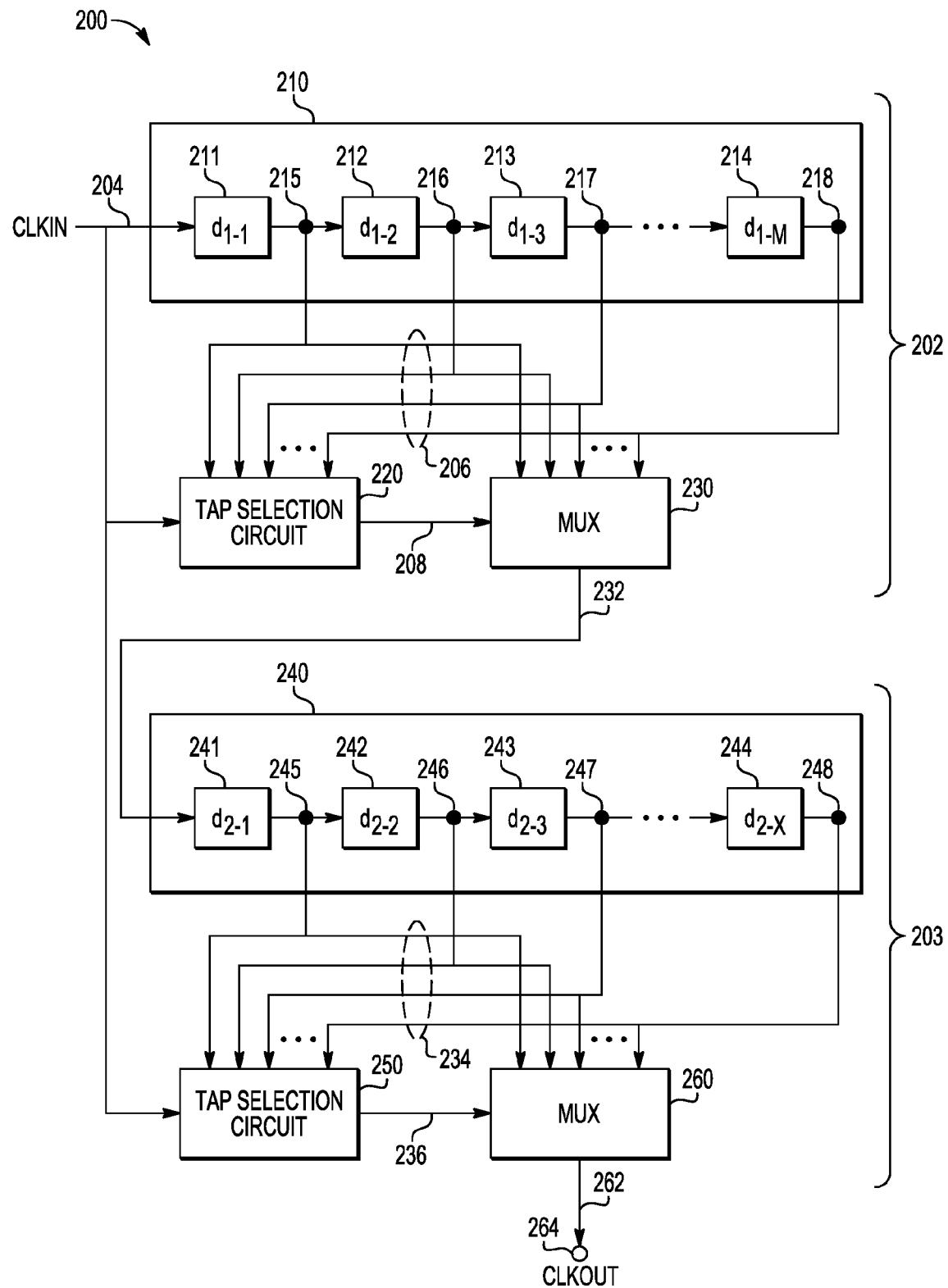
FIG. 2 illustrates a simplified schematic diagram of a two-stage edge alignment circuit adapted to process an input clock signal, according to an example embodiment.

A generalized depiction of a multiple-stage edge alignment circuit 100 having a plurality, N, of delay stages has been described in conjunction with FIG. 1. In order to provide more specific detail regarding the configuration and operation of various embodiments, FIG. 2 illustrates a simplified schematic diagram of a two-stage edge alignment circuit 200 adapted to process an input clock signal, CLKIN, according to an example embodiment. FIG. 2 will be described simultaneously with FIG. 3, which illustrates an example of a timing diagram of signals that may be processed by the two-stage edge alignment circuit of FIG. 2, in accordance with an example embodiment.

Edge alignment circuit 200 is particularly adapted to align a first type of transition edge of an input signal (e.g., a falling edge 312 of a clock signal 310, FIG. 3) with an opposite type of transition edge of a delayed version of the input signal (e.g., a rising edge 321, 331 of delayed signals 320, 330, FIG. 3), according to an embodiment. As used herein, the term "transition edge" may refer to either a rising edge (i.e., low-to-high transition) or a falling edge (i.e., high-to-low transition), and an "opposite" type of transition edge may refer to a type of a transition edge that transitions in an opposite direction (i.e., a falling edge or a rising edge, respectfully). It is to be understood that, in other embodiments, an edge alignment circuit may be adapted to align the same types of transition edges (e.g., a rising edge of an input signal with a rising edge of a delayed signal, or a falling edge of an input signal with a falling edge of a delayed signal). In addition, although edge alignment circuit 200 is described as aligning edges of signals that are essentially square waves having a particular duty cycle, it is to be understood that an edge alignment circuit may be adapted to align portions of a sinusoidal or other time-varying type of signal, according to other embodiments. Finally, although edge alignment circuit 200 is described in terms of aligning edges of an input clock signal (e.g., clock signal 310, FIG. 3) with a delayed version of the input clock signal (e.g., delayed signals 320 and 330, FIG. 3), it is to be understood that edge alignment circuits may be adapted to align other types of time-varying signals, in other embodiments.

Edge alignment circuit 200 includes two delay stages 202, 203, according to an embodiment. Although only two delay stages 202, 203 are illustrated in FIG. 2, it is to be understood that edge alignment circuits may have more than two delay stages, in other embodiments. The illustrated delay stages 202, 203 are referred to herein as "stage-1" 202 and "stage-2" 203. Each stage 202, 203 includes a delay line 210, 240, a tap selection circuit 220, 250, multiplexer (MUX) 230, 260, and possibly additional circuit (not illustrated) associated with MUX 230, 260.

Figure 3:
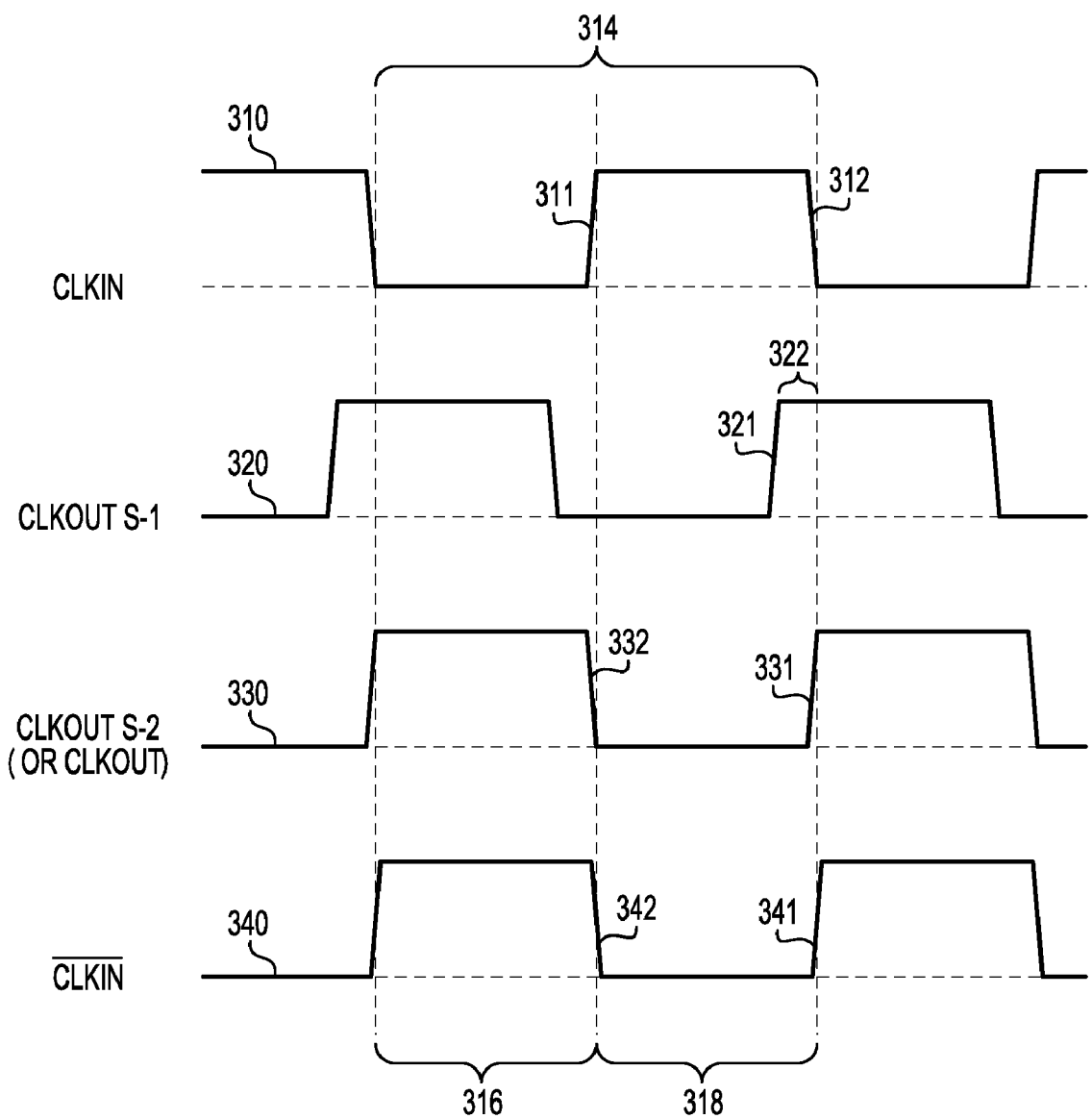
FIG. 3 illustrates an example of a timing diagram of signals that may be processed by the two-stage edge alignment circuit of FIG. 2, in accordance with an example embodiment.

According to an embodiment, an input clock signal (CLKIN) 204 (FIG. 2), 310 (FIG. 3) is received by stage-1 202. More particularly, the input clock signal 204 is received by stage-1 delay line 210. As shown in FIG. 3, the input clock signal 310 is a time-varying, periodic signal having a period 314 that defines the clock frequency. For purposes of example only, the input clock signal 310 may be generated at a frequency of about 1 gigahertz (GHz), which corresponds to a period 314 of about 1000 picoseconds (ps). It is to be understood that, in other embodiments, the input clock signal 310 may be generated at any other frequency (e.g., frequencies in a range of 10 Hz to 100 GHz).

Stage-1 delay line 210 includes a number, M, of series-connected delay elements 211, 212, 213, 214, each of which applies a fixed-width delay, $d_1$, having a first resolution. According to an embodiment, the number, M, of delay elements 211-214 may be in a range of about 5 to about 30 elements, although delay line 210 may include more or fewer delay elements, as well. The first delay element 211 applies the delay to the input clock signal 204, and outputs the delayed clock signal to the second delay element 212. The second and each subsequent delay element 212-214 consecutively apply the fixed-width delay to the already delayed version of the clock signal that it receives. This sequential application of the fixed-width delays results in a plurality of delay line output signals 206 accessible at a tap 215, 216, 217, 218 at the output of each delay element 211-214. Each tap 215-218 may be identified, for example, with an integer number. As used herein, a tap that occurs "earlier" in a delay line than another tap refers to a tap that is positioned closer to the delay line input. For example, in stage-1 delay line 210, tap 215 occurs earlier than tap 218.

Stage-1 tap selection circuit 220 and stage-1 MUX 230 are coupled to taps 215-218, and accordingly, the delay line output signals 206 are received at inputs to stage-1 tap selection circuit 220 and stage-1 MUX 230, as shown in FIG. 2. Stage-1 tap selection circuit 220 also receives input clock signal 204. Stage-1 tap selection circuit 220 is adapted to determine which of the delay line output signals 206 most closely corresponds to a signal having a desired alignment with input clock signal 204 at the output of stage-1 202. According to the embodiment described herein, stage-1 tap selection circuit 220 selects a particular delay line output signal 206 as the signal that has rising edges (e.g., rising edges 321, FIG. 3) that most closely align with falling edges (e.g., falling edges 312, FIG. 3) of the input clock signal 204 after compensation for inherent delays associated with stage-1 202, as will be described in more detail below. Alternatively, stage-1 tap selection circuit 220 may be adapted to determine which of the delay line output signals 206 has falling edges that most closely align with rising edges of the input clock signal 204 after application of the inherent delays associated with stage-1 202, according to another embodiment. In still other embodiments, Stage-1 tap selection circuit 220 may identify a particular delay line output signal 206 based on some other criteria of alignment with input clock signal 204.

As described previously in conjunction with FIG. 1, the identification of a delay line output signal 206 having a desired alignment with input clock signal 204 may be made, for example, by comparing and/or correlating input clock signal 204 (or an inverted or otherwise processed version thereof) with each of the delay line output signals 206. An initially-identified delay line output signal 206 includes the output signal 206 that is closest to having the desired alignment, according to an embodiment. The tap of taps 215-218 associated with the initially-identified delay line output signal 206 may be considered to be an initially-identified tap. The initially-identified tap may be an integer number, for example, that indicates which tap of taps 215-218 corresponds with the initially-identified delay line output signal 206.

According to an embodiment, stage-1 tap selection circuit 220 also performs a tap selection adjustment procedure to determine a finally-identified delay line output signal 206. This determination is made based on the length of the inherent delay associated with stage-1 202 (e.g., an inherent interface circuit delay of the stage-1 MUX 230 and other circuitry, any inherent start up delay of stage-2 203, and any intentional delay adjustment applied (in either direction) to ensure that stage-2 203 is able to delay the signal to a finer alignment resolution). More particularly, stage-1 tap selection circuit 220 may select the finally-identified delay line output signal 206 to be a signal 206 having a smaller delay, when compared with the delay of the initially-identified delay line output signal 206. The difference between the first delay associated with the initially-identified delay line output signal 206 and the finally-identified delay line output signal 206 roughly equals the inherent delay associated with stage-1 202, according to an embodiment.

For example, assume that each delay element 211-214 applies a fixed-width delay of approximately 150 ps, the inherent delay of MUX 230 and other interface circuit is known to be approximately 120 ps, and the start up delay of stage-2 203 is approximately 50 ps. To align falling edges of an input clock signal 204 having approximately a 1000 ps period with rising edges of a delayed version of the input clock signal, a delay of approximately 500 ps at the output of stage-1 202 would be desired. A version of the input clock signal 204 that is delayed by an amount of time that is closest to about 500 ps would occur at the output of the third delay element 213 (for a delay of about 450 ps), since the cumulative delay applied to the input signal at that point would be 3×150 ps (i.e., the delay element number (3) times the fixed-width delay (150 ps)). Accordingly, the stage-1 tap selection circuit 220 may select the output signal 206 produced at the tap of the third delay element to be the initially-identified delay line output signal 206.

However, because MUX 230 and other associated circuit inherently would apply an additional delay of about 120 ps to the output signal 206 produced at the tap for the third node, and because the stage-2 delay line 240 has an inherent start up delay of about 50 ps, according to the example, selection of the third node's output signal 206 may cause the resulting output signal 232 of stage-1 202 effectively to have about 170 ps of additional and undesirable mis-alignment with the input clock signal 204. According to an embodiment, the potential for this mis-alignment is eliminated by determining the finally-identified delay line output signal 206 and the finally-identified tap of taps 215-218 to be a number of taps earlier than the third tap 217. According to an embodiment, the number of taps corresponding to the adjustment equals the inherent delay of stage-1 202 (e.g., 170 ps) divided by the fixed-width delay of each delay element 211-214 (e.g., 150 ps), and rounded to the nearest integer. This would result in an adjustment of one (1) tap toward lesser cumulative delay, in the above-given example. Accordingly, the finally-identified delay line output signal 206 would correspond to the output signal 206 produced at the tap 216 of the second delay element 212, rather than the third delay element 213. The tap 216 of the second delay element 212 would be the finally-identified tap. In this example, sufficient mis-alignment to ensure that stage-2 203 is able to delay the signal to a finer alignment resolution already is present, and therefore an additional tap adjustment would not be warranted. However, when the mis-alignment is not sufficient to ensure that stage-2 203 is able to delay the signal further, tap selection circuit 220 may instead select an additional tap toward lesser cumulative delay (e.g., it may select the first tap 215).

Stage-1 tap selection circuit 220 provides a control signal 208 to stage-1 MUX 230, indicating the finally-identified delay line output signal 206 or the finally-identified tap 215-218. Responsive to the control signal 208, stage-1 MUX 230 outputs the indicated delay line output signal 206 (e.g., the second signal 206) as the ultimate output signal 232 of stage-1 202. As a result of the tap selection adjustment procedure performed by stage-1 tap selection circuit 220, the output signal 232 may have edges that are more closely aligned with edges of the input clock signal 204 than they would be if stage-1 tap selection circuit 220 did not perform the tap selection adjustment procedure.

For example, referring also to FIG. 3, an output signal 320 (indicated as CLKOUT S-1) corresponding to output signal 232 reflects the delay line output signal 206 having rising edges 321 that are most closely aligned with the falling edges 312 of the input clock signal 310, despite the inherent delays of stage-1 202. According to an embodiment, the fixed-width delay of each delay element 211-214 of stage-1 202 may have a resolution that may produce mis-aligned target edges, according to design specifications. For example, FIG. 3 illustrates that an alignment error 322 exists between the falling edges 312 of the input clock signal 310 and the rising edges 321 of the stage-1 output signal 320. According to an embodiment and as discussed previously, some mis-alignment between target edges is desirable in each stage (e.g., stage-1 202) other than a final stage (e.g., stage-2 203) to ensure that enough of a time difference is present between the target edges (e.g., alignment error 322) to allow any subsequent delay stage (e.g., stage-2 203) to further delay its respective input signal to a finer resolution. Accordingly, stage-1 tap selection circuit 220 is adapted to select the finally-identified tap of taps 215-218 to ensure an intentional mis-alignment. In contrast, the tap selection circuit of the final stage (e.g., stage-2 tap selection circuit 250, discussed later) would not select a finally-identified tap of taps 245-248 to ensure an intentional mis-alignment.

Continuing through the remainder of circuit 200, the stage-1 output signal 232 is received by stage-2 203. More particularly, the stage-1 output signal 232 is received by stage-2 delay line 240. Stage-2 delay line 240 is similar in configuration to stage-1 delay line 210, in that stage-2 delay line 240 includes a number, X, of series-connected delay elements 241, 242, 243, 244, each of which applies a fixed-width delay, d2. However, according to an embodiment, the resolution of the delay elements of the stage-2 delay line 240 is finer than the resolution of the delay elements of the stage-1 delay line 210. In other words, the delay, d1, of the delay elements of the stage-1 delay line 210 is longer than the delay, d2, of the delay elements of the stage-2 delay line 240. The number, X, of delay elements 241-244 in stage-2 delay line 240 may be the same or different from the number, M, of delay elements 211-214 in stage-1 delay line 210. In stage-2 delay line 240, the sequential application of the fixed-width delays results in a plurality of delay line output signals 234 accessible at a tap 245, 246, 247, 248 at the output of each delay element 241-244. As discussed previously, the inherent start up delay for stage-2 delay line 240 is compensated for by stage-1 tap selection circuit 220 in its selection of the finally-identified tap of stage-1 delay line 210.

The delay line output signals 234 are received at inputs to stage-2 tap selection circuit 250 and stage-2 MUX 260, as shown in FIG. 2. Stage-2 tap selection circuit 250 also receives input clock signal 204. In a substantially similar manner as the stage-1 tap selection circuit 220, the stage-2 tap selection circuit 250 is adapted to determine which of the delay line output signals 234 most closely corresponds to a signal having the desired alignment with input clock signal 204. The determination results in an initially-identified delay line output signal 234 and an initially-identified tap of taps 245-248.

In a substantially similar manner as the stage-1 tap selection circuit 220, stage-2 tap selection circuit 250 also performs a tap selection adjustment procedure to determine a finally-identified delay line output signal 234 and a finally-identified tap of taps 245-248, according to an embodiment. This determination is made based on the length of an inherent delay associated with stage-2 MUX 260 and other interface circuitry between the output of stage-2 delay line 240 and the output 264 of the edge alignment circuit 200. However, in contrast with stage-1 202, the inherent delay of stage-2 203 includes only the delay associated with stage-2 MUX 260 and other interface circuitry (e.g., because there is no next stage, the inherent delay does not include any inherent start up delay of any next stage). In addition, the finally-identified tap of stage-2 203 does not need to be selected to ensure that a time difference is present between the target edges for alignment, since stage-2 203 corresponds to the final and finest alignment resolution.

Once the finally-identified delay line output signal 234 has been determined, the stage-2 tap selection circuit 250 provides a control signal 236 to the stage-2 MUX 260, which indicates the finally-identified tap of taps 245-248. Stage-2 MUX 260 is adapted to receive the delay line output signals 234, and to allow only one of the delay line output signals 234 to be output as the stage-2 output signal 262. According to an embodiment, the delay line output signal 234 that is output as the stage-2 output signal 262 corresponds to the delay line output signal 234 corresponding to the finally-identified tap of taps 245-248 indicated in control signal 236.

For example, referring also to FIG. 3, an output signal 330 (indicated as CLKOUT S-2 or CLKOUT) corresponding to output signal 262 reflects the delay line output signal 234 having rising edges 331 that are even more closely aligned with the falling edges 312 of the input clock signal 310, despite the inherent delays applied by MUX 260 and other interface circuitry. According to an embodiment, the fixed-width delay of each delay element 241-244 of stage-2 203 may have a resolution that may produce sufficiently aligned signals, according to design specifications. For example, FIG. 3 illustrates that no significant alignment error exists between the falling edges 312 of the input clock signal 310 and the rising edges 331 of the stage-2 output signal 330. Said another way, stage-1 202 produces an output signal 232, 320 that is relatively coarsely aligned with the input clock signal 204, 310, and stage-2 203 produces an output signal 262, 330 that is relatively more finely aligned (i.e., more accurately aligned) with the input clock signal 204, 310. As will be described in more detail below, the output signal of the final stage of the edge alignment circuit (e.g., output signal 262 of stage-2 203) may be used to provide alignment information for other circuit that is designed to measure signal characteristics and/or to perform signal correction, filtering or other procedures (e.g., duty cycle measurement and/or correction, jitter measurement and/or correction, and digital filtering, among other things).

Figure 4:
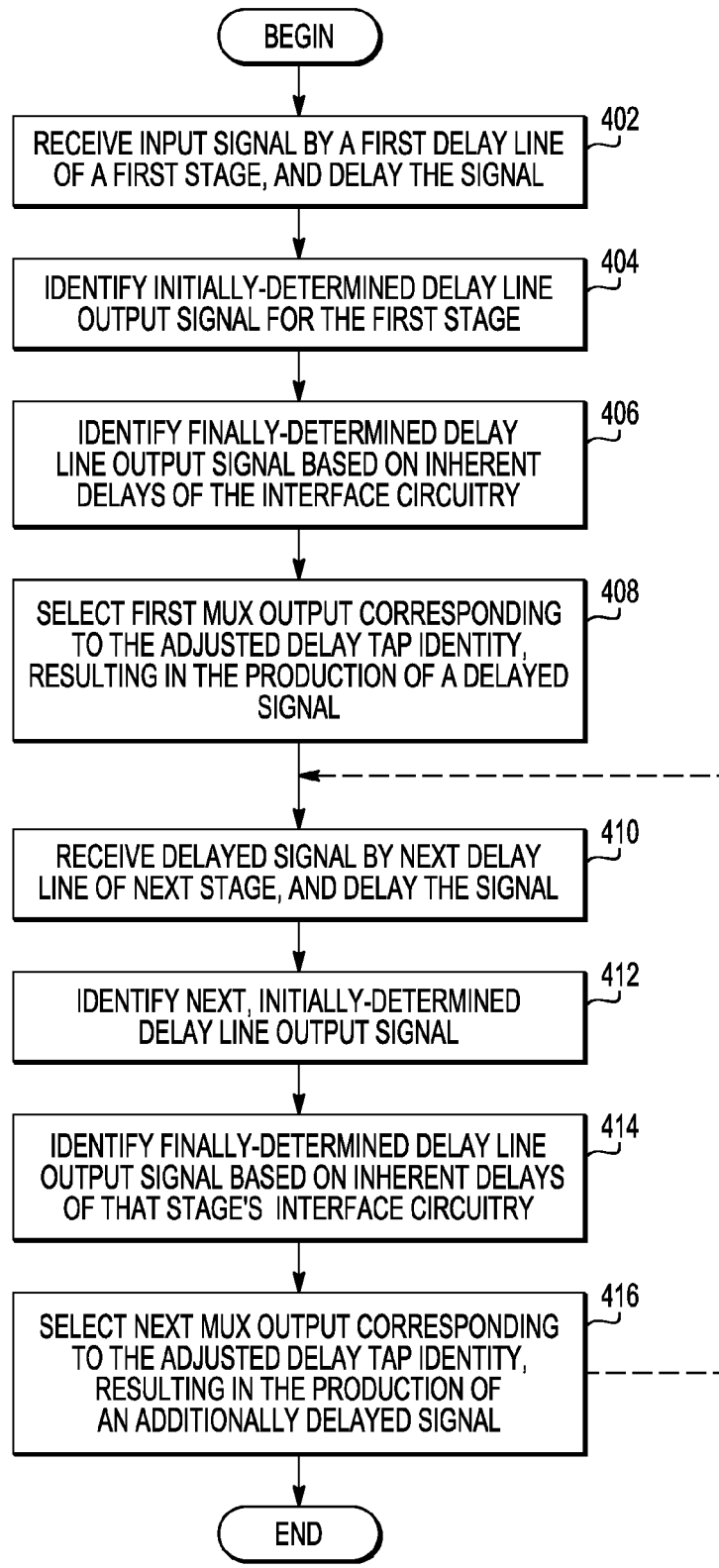
FIG. 4 is a flowchart of a method for performing a multiple-stage edge alignment process, in accordance with an example embodiment.

FIG. 4 is a flowchart of a method for performing a multiple-stage edge alignment process, in accordance with an example embodiment. The method may be performed, for example, by a multiple-stage edge alignment apparatus such as illustrated in FIG. 1 or 2, according to various embodiments. The method begins, in block 402, when an input signal (e.g., signal 140, FIG. 1 or 204, FIG. 2) is received by a first delay line of a first stage of the multiple-stage edge alignment apparatus (e.g., stage-1 delay line 110, FIG. 1 or stage-1 delay line 210, FIG. 2). As discussed previously, the input signal may be a periodic clock signal (e.g., clock signal 204, FIG. 2 or 310, FIG. 3), another type of periodic signal, or a portion of an aperiodic signal that is periodic during signal edge alignment, according to various embodiments. The received signal is delayed by the plurality of elements of the delay line, as discussed previously.

In block 404, a tap of the first delay line is identified (e.g., by tap selection circuit 120, FIG. 1 or 220, FIG. 2), which corresponds to a coarsely-aligned output signal of the first stage (e.g., signal 141, FIG. 1 or 232, FIG. 2). As discussed in detail above, the tap of the first delay line may be identified by first identifying an initially-identified delay line output signal (e.g., one of signals 150, FIG. 1 or 206, FIG. 2) that has a characteristic of being most closely aligned, in a desired manner, with the input signal (e.g., the rising edge of the delayed signal is more closely aligned with the falling edge of the input signal than for any other delayed signal produced by the first delay line). After selecting the initially-identified delay line output signal and a corresponding initially-identified tap, a finally-identified delay line output signal and a finally-identified tap are identified, in block 406. According to an embodiment, this may include identifying a number of taps that corresponds with the inherent delay associated with the first stage, and then determining an offset from the initially-identified tap that corresponds to the inherent delay. In block 408, an interface circuit output (e.g., a MUX output) is selected by providing a control signal to the interface circuit, which indicates the finally-identified tap. This results in the production of a delayed signal at the output of the first stage.

In block 410, the delayed signal at the output of the first stage (e.g., stage-1 delay line 110, FIG. 1 or stage-1 delay line 210, FIG. 2) is received by a "next" delay line of a next stage of the multiple-stage edge alignment apparatus. In block 412 a tap of the next delay line is identified (e.g., by tap selection circuit 121, FIG. 1 or 250, FIG. 2), which corresponds to a more finely-aligned output signal of the stage (e.g., signal 142, FIG. 1 or 262, FIG. 2). The tap of the next delay line may be identified by first selecting an initially-identified delay line output signal (e.g., one of signals 151, FIG. 1 or 234, FIG. 2) that has a characteristic of being most closely aligned, in a desired manner, with the input signal. After selecting the initially-identified delay line output signal and a corresponding initially-identified tap, a finally-identified delay line output signal and a finally-identified tap are identified, in block 414. According to an embodiment, this may include determining a number of taps that corresponds with the inherent delay associated with that stage, and then determining an offset from the initially-identified tap that corresponds to the inherent delay. In block 416, an interface circuit output (e.g., a MUX output) is selected by providing a control signal to the interface circuit indicating the finally-identified tap. This results in the production of a delayed signal at the output of the stage.

In a two-stage, edge alignment circuit (e.g., as depicted in FIG. 2), the delayed signal corresponds to the output signal of the edge alignment circuit. In an edge alignment circuit that includes more than two stages (e.g., as depicted in FIG. 1), blocks 410-416 may be repeated for each additional, subsequent stage, as indicated by the dashed line in FIG. 4. Once an output signal (e.g., signal 144, FIG. 1 or 262, FIG. 2) has been produced at the output of the edge alignment circuit, the method may end.

Figure 5:
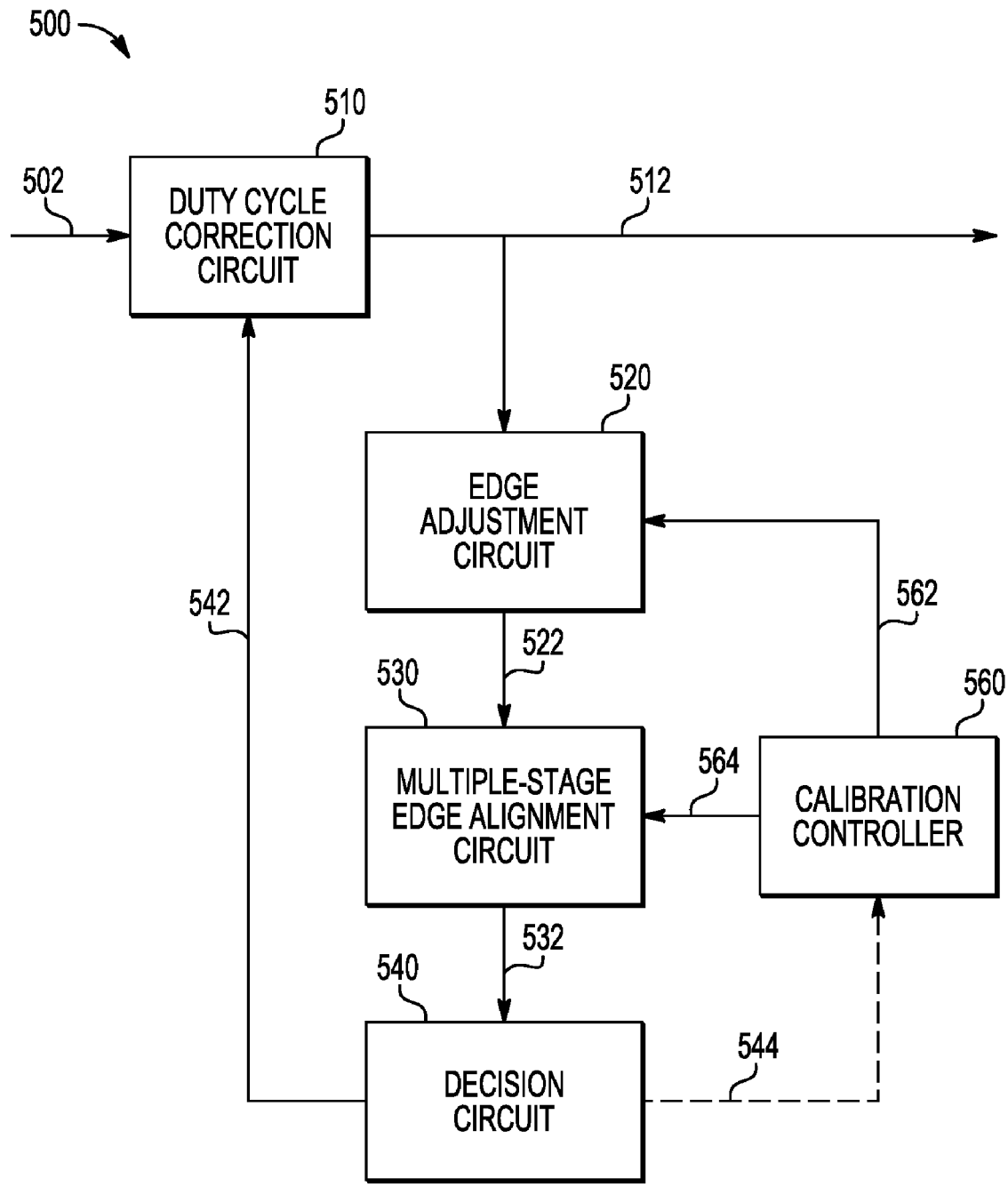
FIG. 5 illustrates a simplified block diagram of a duty cycle correction apparatus with a multiple-stage edge alignment circuit, in accordance with an example embodiment.

As mentioned previously, the output of the multiple-stage, edge alignment circuit may be used for any of a number of measurements, calculations, signal processing tasks, and/or signal corrections. For example, FIG. 5 illustrates a simplified block diagram of a duty cycle correction apparatus 500 with a multiple-stage edge alignment circuit 530, in accordance with an example embodiment. Duty cycle correction apparatus 500 includes a duty cycle correction circuit 510, an edge adjustment circuit 520, a multiple-stage edge alignment circuit 530, and a decision circuit 540, according to an embodiment. Duty cycle correction apparatus 500 also may include a calibration controller 560, which is useful during a post-fabrication calibration procedure, and which will be described in more detail later in conjunction with FIG. 7.

An input signal 502 is first received by duty cycle correction circuit 510, which is adapted to perform signal processing on the input signal 502 in order to correct for duty cycle errors that may be identified by decision circuit 540, as will be described in more detail below. For ease of description, assume initially that no correction is performed. Regardless, the output of the duty cycle correction circuit 510 will be referred to below as a "corrected" input signal 512. The corrected input signal 512 corresponds to the output signal of the duty cycle correction apparatus 500.

In order to determine whether and how the duty cycle correction circuit 510 should correct the duty cycle, the corrected input signal 512 is received and processed by a "duty cycle evaluation circuit," which includes edge adjustment circuit 520, multiple-stage edge alignment circuit 530, and decision circuit 540. According to an embodiment, edge adjustment circuit 520 is adapted to adjust a transition edge of corrected input signal 512 either forward or backward in time by an "edge adjustment time" in order to compensate for inherent duty cycle errors in the duty cycle evaluation circuit. The edge adjustment time is determined during a calibration procedure, as will be described in more detail in conjunction with FIG. 7. Edge adjustment circuit 520 produces a signal that is referred to herein as an "edge-adjusted input signal" 522.

The edge-adjusted input signal 522 is received by multiple-stage, edge alignment circuit 530 (e.g., circuit 100, FIG. 1 or 200, FIG. 2). According to an embodiment, edge alignment circuit 530 is adapted to generate an output signal 532 that is aligned with the edge-adjusted input signal 522 in a desired manner, as described above in detail and in accordance with the various embodiments. For example, as discussed previously, output signal 532 may have its rising edges (e.g., rising edges 331, FIG. 3) aligned with the falling edges (e.g., falling edges 312, FIG. 3) of the edge-adjusted input signal 522, in an embodiment. According to an embodiment, edge alignment circuit 530 also may apply a "calibrated delay" to the edge-adjusted input signal in order to compensate for inherent delay errors in the duty cycle evaluation circuit. The calibrated delay also is determined during the calibration procedure, as will be described in more detail in conjunction with FIG. 7.

Decision circuit 540 receives the output signal 532 of the edge alignment circuit 530. Decision circuit 540 is adapted to evaluate the output signal 532 in order to determine whether the duty cycle is correct (e.g., substantially equal to 50 percent) or incorrect (e.g., not substantially equal to 50 percent). According to an embodiment, decision circuit 540 may invert either the input signal 512 or the output signal 532 and evaluate the alignment of other edges of the signals, which were not previously aligned by the edge alignment circuit 530. For example, referring again to FIG. 3, signal 340 represents an inverted version of input clock signal 310 (e.g., an inverted version of input signal 512). Although the rising edges 331, 341 of the output signal 330 and the inverted input signal 340 remain aligned by virtue of the alignment process performed by the edge alignment circuit (e.g., circuit 100, FIG. 1, 200, FIG. 2 or 530, FIG. 5), the falling edges 332, 342 of the output signal 330 and the inverted signal 340 are not necessarily aligned.

When the decision circuit 540 determines that the falling edges are aligned within a specified tolerance (e.g., within 1 ps or some other value), then decision circuit 540 may determine that the duty cycle is correct. However, when the decision circuit 540 determines that the falling edges are not aligned within a specified tolerance, then the decision circuit 540 may determine that the duty cycle is not correct. For example, the falling edges 332, 342 may not be aligned when the portion 318 of the period of the inverted signal 340 during which the signal is high is significantly longer or shorter than the portion 318 of the period of the inverted signal 340 during which the signal is low.

According to an embodiment, when decision circuit 540 determines that the duty cycle is correct (e.g., the duty cycle is substantially 50 percent), decision circuit 540 may produce a decision result signal 542, which indicates that the current duty cycle correction being performed by duty cycle correction circuit 510 should not be changed. When decision circuit 540 determines that the duty cycle is too low (e.g., the duty cycle is significantly less than 50 percent), decision circuit 540 may produce a decision result signal 542, which indicates that the duty cycle correction circuit 510 should adjust its current level of correction in a manner that the duty cycle of the corrected input signal 512 is increased. Conversely, when decision circuit 540 determines that the duty cycle is too high (e.g., the duty cycle is significantly greater than 50 percent), decision circuit 540 may produce a decision result signal 542, which indicates that the duty cycle correction circuit 510 should adjust its current level of correction in a manner that the duty cycle of the corrected input signal 512 is decreased. The duty cycle evaluation and correction continues to be performed during operation to dynamically increase or decrease the duty cycle of the input signal 502 as needed.

Figure 6:
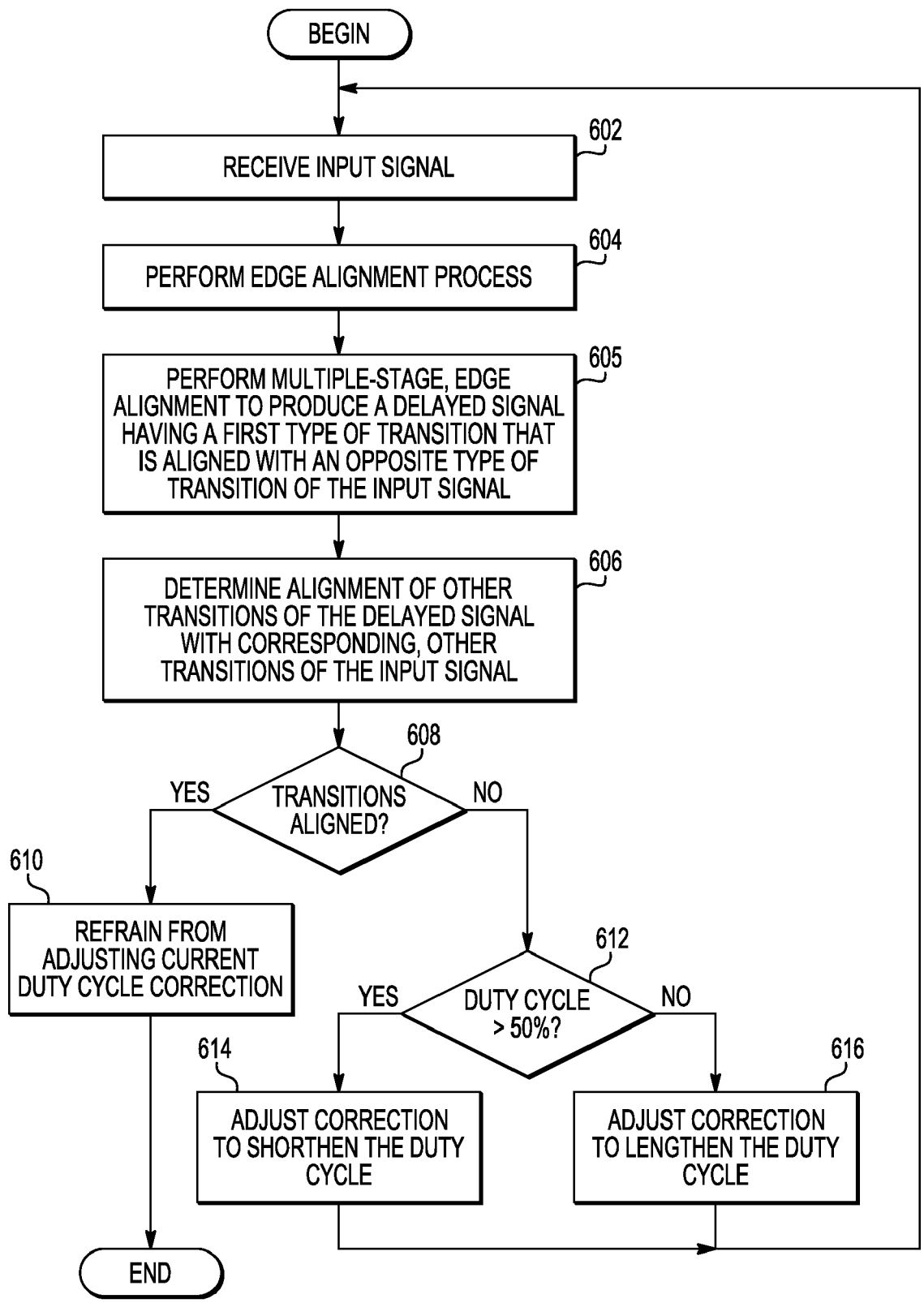
FIG. 6 is a flowchart of a method for performing duty cycle correction, in accordance with an example embodiment.

FIG. 6 is a flowchart of a method for performing duty cycle correction, in accordance with an example embodiment. The method may be performed, for example, by a duty cycle correction apparatus, such as the one illustrated and discussed in conjunction with FIG. 5. The method begins, in block 602, by receiving an input signal (e.g., input signal 512, FIG. 5 or 310, FIG. 3). In block 604, an edge adjustment process may be performed in order to adjust a transition edge of the input signal either forward or backward in time, resulting in an edge-adjusted input signal (e.g., edge-adjusted input signal 522, FIG. 5). In block 605, a multiple-stage, edge alignment process may then be performed to produce a delayed signal (i.e., a delayed version of input signal 522, such as signal 330, FIG. 3), which has a first type of transition (e.g., rising edges 331, FIG. 3) that is substantially aligned with an opposite type of transition (e.g., falling edges 312, FIG. 3) of the input signal.

In block 606, the alignment is determined between "other" transitions of the delayed signal (e.g., falling edges 332, FIG. 3) and corresponding other transitions of the input signal (e.g., rising edges 311, FIG. 3). This determination may be made by comparing the input signal (e.g., input clock signal 310) with the delayed signal (e.g., signal 330) or by comparing a processed version of the input signal (e.g., inverted input signal 340) with the delayed signal (e.g., signal 330).

In block 608, a determination may be made whether these "other" transitions are aligned. If so, then the duty cycle correction circuit refrains from adjusting the duty cycle correction that is currently being performed (e.g., by duty cycle correction circuit 510, FIG. 5), in block 610, and the method ends. When the other transitions are not sufficiently aligned, then a determination may be made whether the duty cycle is greater than 50 percent, in block 612 (or less than 50 percent, in another embodiment). When the duty cycle is greater than 50 percent, then in block 614, the duty cycle correction is controlled to adjust the current duty cycle correction being performed, if any, in a manner that results in shortening the duty cycle. Conversely, when the duty cycle is less than 50 percent, then in block 616, the duty cycle correction is controlled to adjust the current duty cycle correction being performed, if any, in a manner that results in lengthening the duty cycle. The method then continues to iterate as shown in FIG. 6.

Referring again to FIG. 5, and as mentioned previously, a post-fabrication calibration procedure may be performed in order to calibrate duty cycle correction apparatus 500. More specifically, a post-fabrication calibration procedure may be performed in order to determine the edge adjustment time for edge adjustment circuit 520 and a set of delay offset compensation values (e.g., one value for each stage) for multiple-stage edge alignment circuit 530. According to various embodiments, a post-fabrication calibration procedure may be performed in the factory on a single duty cycle correction apparatus or simultaneously on a plurality of apparatus (e.g., a plurality of duty cycle correction apparatus on a same wafer). According to other embodiments, post-fabrication calibration procedures may be performed periodically or occasionally during normal operation of a device within which the duty cycle correction apparatus is incorporated.

Figure 7:
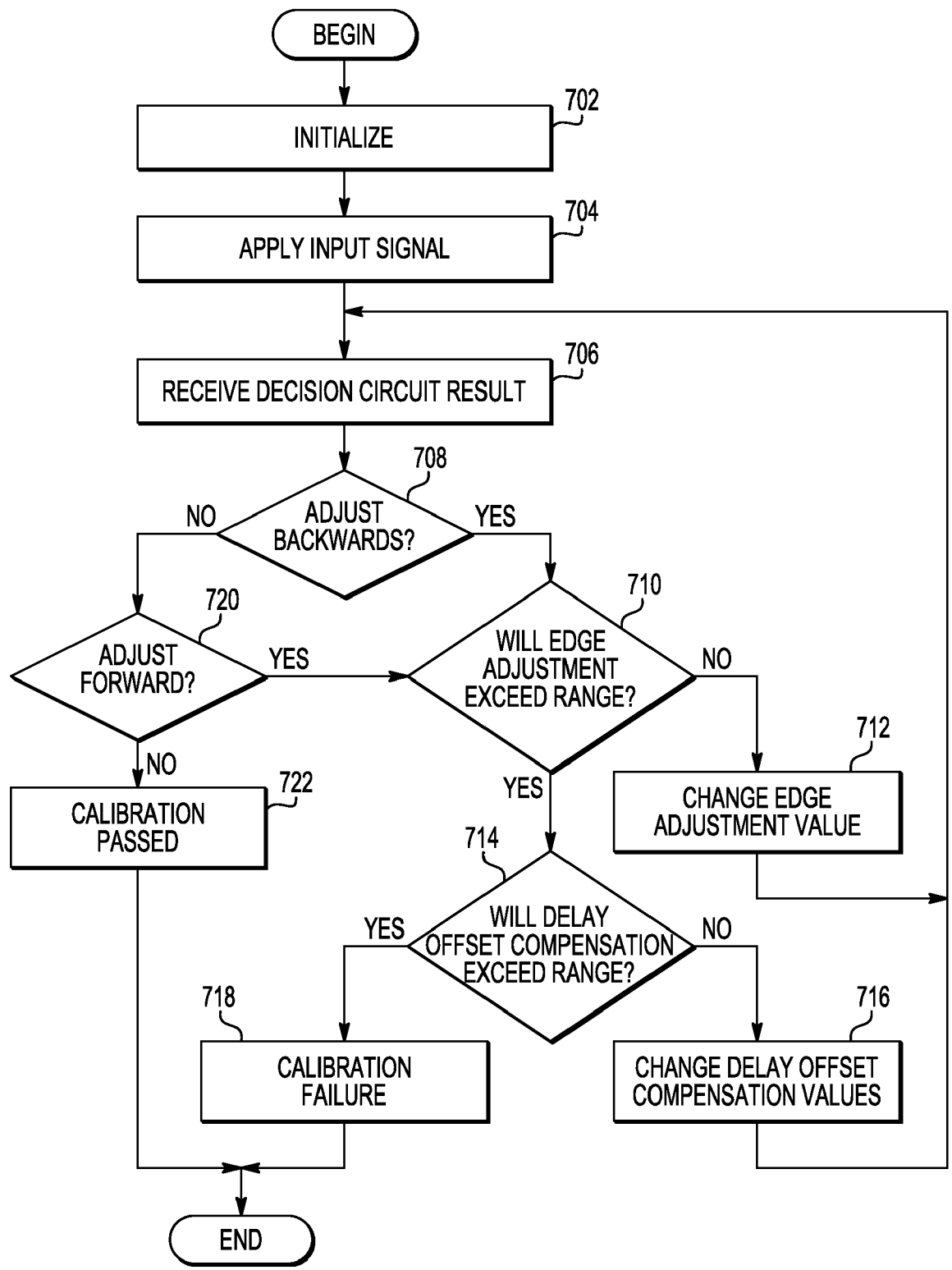
FIG. 7 is a flowchart of a method for performing a post-fabrication calibration procedure, in accordance with an example embodiment.

FIG. 7 is a flowchart of a method for performing a post-fabrication calibration procedure, in accordance with an example embodiment. Referring also to FIG. 5, calibration of a duty cycle correction apparatus (e.g., duty cycle correction apparatus 500, FIG. 5) is performed using a calibration controller 560. The calibration controller 560 may be integrally included on an integrated circuit that also includes other portions of the duty cycle correction apparatus 500, or the calibration controller 560 may include external circuit components that are connectable with the duty cycle correction apparatus through ports or other connection apparatus.

The post-fabrication calibration procedure may begin by initializing an edge adjustment value and a set of delay offset compensation values, in block 702. According to an embodiment, this may include the calibration controller 560 initializing the edge adjustment value to zero and delay offset compensation values to a pre-specified set of minimum delay values. According to an embodiment, a delay offset compensation value is initialized for each stage of the duty cycle correction apparatus. The minimum delay value for each stage may be on the order of the delay associated with one delay element of the stage, although it may be some other value, as well. As discussed previously, the edge adjustment value and the delay offset compensation values are applied in order to compensate for inherent duty cycle and delay errors imposed by the duty cycle evaluation circuit. More specifically, the edge adjustment value represents the time increment that the edge adjustment circuit (e.g., edge adjustment circuit 520, FIG. 5) will adjust a transition edge of an input signal (e.g., a reference signal) either forward or backward in order to adjust the duty cycle of the input signal. The delay offset compensation values represent amounts of delay to be applied by the various stages of the edge alignment circuit (e.g., edge alignment circuit 530, FIG. 5). In other words, for each stage, its associated delay offset compensation value represents the difference between the delay associated with the initially-selected delay line output signal and the finally-selected delay line output signal, as discussed in detail above.

In block 704, the calibration controller 560 may produce a control signal (not illustrated) that causes a calibration input signal (e.g., a reference signal) to be provided as the input signal 502 to the duty cycle correction apparatus 500. The calibration input signal 502 is generated precisely to have a pre-specified duty cycle, according to an embodiment. The pre-specified duty cycle may be precisely a fifty percent duty cycle, according to an embodiment. According to other embodiments, the pre-specified duty cycle may be greater or less than fifty percent (e.g., 45 percent, 55 percent, or some other value). According to yet another embodiment, the calibration input signal 502 may not be generated to have a pre-specified duty cycle.

During the calibration procedure, the duty cycle correction circuit 510 passes the calibration input signal 502 without alteration as an input signal 512 to the edge adjustment circuit 520. The edge adjustment circuit 520 adjusts a transition edge of the calibration input signal 512 by the edge adjustment value (initially set to zero), and the edge alignment circuit 530 applies delays that are adjusted by the delay offset compensation values (initially set to the minimum delay values) to the resulting edge-adjusted input signal 522.

Finally, the decision circuit 540 evaluates the resulting output signal 532, and determines whether the duty cycle of the calibration input signal 512 appears to be a target duty cycle. According to an embodiment, the target duty cycle and the pre-specified duty cycle may be equal (e.g., both may be fifty percent). In such an embodiment, the result of the calibration procedure is to tune out unintentional duty cycle distortions that may be applied by the duty cycle correction apparatus 500. According to other embodiments, the target duty cycle and the pre-specified duty cycle may be different. For example, an embodiment may include providing a calibration input signal having a pre-specified duty cycle with a first value (e.g., 45 percent or 55 percent), and adjusting the signal to a target duty cycle having a second, different value (e.g., 50 percent). In such an embodiment, the result of the calibration procedure is to apply intentional duty cycle distortions to the signal being processed.

Either way, decision circuit 540 produces a calibration decision result signal 544, which indicates that either the duty cycle of calibration input signal appears to be precisely the target duty cycle, or that the duty cycle appears to be lower or higher than the target duty cycle. The calibration decision result signal 544 is represented as a dashed line to indicate that it is provided in conjunction with the calibration procedure, rather than during normal operations.

The calibration decision result signal 544 is received by the calibration controller 560. Based on the calibration decision result signal 544, the calibration controller 560 makes a determination, in block 708, of whether the transition edge that is to be adjusted by the edge adjustment circuit 520 should be adjusted backwards, according to an embodiment. This determination may be made, for example, when the calibration controller 560 determines, based on the calibration decision result signal 544, that some performance metric is not met. For example, a performance metric may be that the duty cycle of the calibration input signal appears to be equal to the target duty cycle, in an embodiment. In such an embodiment, when the calibration decision result signal 544 indicates that the duty cycle of the calibration input signal appears to be greater than the target duty cycle, the calibration controller 560 may determine that the transition edge should be adjusted backwards. Other performance metrics may be evaluated, in other embodiments. For example but not by way of limitation, another performance metric may be that a bus-interface that utilizes the output signal 512 is performing at or above a target bus interface speed.

When the calibration controller 560 determines that the transition edge should be adjusted backwards, then a decision may be made, in block 710, of whether a change to the edge adjustment value will cause the edge adjustment value to exceed a range of acceptable edge adjustment values. For example, the range of acceptable adjustment values may be between 0 and a time period corresponding to a delay applied by a percentage of delay elements (e.g., 25 percent of the delay elements of the first delay stage, or some other percentage), according to an embodiment. The range may be different, in other embodiments. When a change to the edge adjustment value will not exceed the range, then in block 712, the calibration controller 560 provides the edge adjustment circuit 520 with an updated edge adjustment value 562. According to an embodiment, the edge adjustment value is changed (e.g., by an incremental amount) to cause a larger backward adjustment, and the method iterates as shown.

Referring again to block 710, when a determination is made that a change to the edge adjustment value will cause the edge adjustment value to exceed the range of acceptable edge adjustment values, then no further changes may be made to the edge adjustment value. In such a case, a further determination may be made of whether a change to the delay offset compensation values will cause the delay offset compensation values to exceed ranges of acceptable delay offset compensation values (e.g., where one range is established for each delay stage), in block 714. For example, the range of acceptable delay offset compensation values for any given stage may be from the minimum delay value to a time period corresponding to a delay applied by a percentage of delay elements (e.g., 25 percent of the delay elements of the delay stage, or some other percentage), according to an embodiment. The ranges may be different, in other embodiments. When a change to a delay offset compensation value for a given delay stage will not cause the delay offset compensation value to exceed the range for that delay stage, then in block 716, the calibration controller 560 provides the edge alignment circuit 530 with an updated delay offset compensation value 564 for that delay stage. According to an embodiment, the delay offset compensation values are changed (e.g., by incremental values) to cause a larger delay, and the method iterates as shown. When a determination is made, in block 714, that a changes to the delay offset compensation values will cause the delay offset compensation values to exceed the ranges of acceptable delay offset compensation values, then no further changes may be made to the delay offset compensation values. In such a case, the calibration process has failed, and an indication to that effect may be generated, in block 718. The calibration method may then end.

Referring again to block 708, when a determination is made that the transition edge that is to be adjusted by the edge adjustment circuit 520 should not be adjusted backwards, then a further determination is made, in block 720, of whether the transition edge should be adjusted forward. Again, this determination may be made, for example, when the calibration controller 560 determines, based on the calibration decision result signal 544, that some performance metric is not met. For example, as discussed previously, a performance metric may be that the duty cycle of the calibration input signal appears to be equal to the target duty cycle, in an embodiment. In such an embodiment, when the calibration decision result signal 544 indicates that the duty cycle of the calibration input signal appears to be less than the target duty cycle, the calibration controller 560 may determine that the transition edge should be adjusted forward. Other performance metrics may be evaluated, in other embodiments.

When a determination is made that the transition edge should be adjusted forward, then the process may proceed to block 710, in which a determination may be made as to whether a change to the edge adjustment value will cause the edge adjustment value to exceed the range of acceptable values, as discussed previously. When it is determined, in block 720, that the transition edge should not be adjusted forward, then the edge adjustment value and the delay offset compensation values are considered to have converged to accurate calibrated values. In that case, the calibration procedure has passed, and an indication to that effect may be generated, in block 722. The method may then end.

In the embodiment illustrated in FIG. 7 and discussed above, both the edge adjustment value and the set of delay offset compensation values are determined through the calibration process. In an alternate embodiment, only the edge adjustment value may be determined through the calibration process. Accordingly, blocks 714 and 716 may be excluded, and block 710 would transition to block 718 when a change to the edge adjustment value would cause the edge adjustment value to exceed the range of acceptable edge adjustment values.

It is to be understood that certain ones of the process blocks depicted in FIGS. 4, 6, and 7 may be performed in parallel with each other or with performing other processes. In addition, it is to be understood that the particular ordering of the process blocks depicted in FIGS. 4, 6, and 7 may be modified, while achieving substantially the same result. Accordingly, such modifications are intended to be included within the scope of the inventive subject matter.

Thus, various embodiments of methods and apparatus for aligning the edges of multiple signals have been described above. An embodiment of a signal edge alignment apparatus comprises multiple delay stages connected in series and each having a delay stage input and a delay stage output. Each delay stage is characterized by an inherent delay, and each delay stage includes a delay line, an interface circuit, and a tap selection circuit. The delay line is coupled to the delay stage input and is adapted to receive an input signal. The delay line includes a plurality of delay elements connected in series, and a plurality of taps associated with the plurality of delay elements. The delay elements are adapted sequentially to apply fixed-width delays to the input signal in order to produce a plurality of delayed versions of the input signal at the taps. The interface circuit has an interface circuit input and an interface circuit output. The interface circuit input is coupled with the taps, and the interface circuit is adapted to pass a delayed version of the input signal from one of the taps to the interface circuit output in response to a control signal. The inherent delay of the delay stage includes an inherent interface circuit delay between the interface circuit input and the interface circuit output. The tap selection circuit is coupled with the taps and with the interface circuit. The tap selection circuit is adapted to identify a finally-identified tap of the plurality of taps by determining an initially-identified tap at which a delayed version of the input signal most closely has a desired alignment with the input signal, and by identifying the finally-identified tap in the control signal as a tap that occurs earlier in the delay line than the initially-identified tap in order to compensate for the inherent delay of the interface circuit.

Another embodiment of a signal edge alignment apparatus comprises a first delay line, a first interface circuit, and a first tap selection circuit. The first delay line is adapted to receive and delay an input signal. The first delay line includes a plurality of first delay elements connected in series and a plurality of first taps of the first delay elements. Each of the first delay elements is adapted to apply a first delay having a first width, and the first delay line is further adapted to produce, at the first taps, a plurality of first delayed signals, which represent delayed versions of the input signal. The first interface circuit has a first interface circuit input and a first interface circuit output. The first interface circuit input is coupled with the first taps, and the first interface circuit is adapted to pass a first finally-identified signal present at a first finally-identified tap of the first taps to the first interface circuit output in response to a first control signal. The first interface circuit is characterized by a first inherent interface circuit delay between the first interface circuit input and the first interface circuit output. The first tap selection circuit is adapted to receive the first delayed signals and the input signal, and to identify a first initially-identified tap as a tap of the first taps that corresponds to a first initially-identified signal of the first delayed signals. Of all of the first delayed signals, the first initially-identified signal is closest to having a desired alignment, in time, with the input signal. The first tap selection circuit is further adapted to identify the first finally-identified tap by adjusting the first initially-identified tap by a first number of taps. The first number of taps is determined based on the first inherent interface circuit delay, and the first tap selection circuit is further adapted to identify the first finally-identified tap in the control signal.

An embodiment of a method for aligning a first signal with a second signal includes receiving the first signal at a first delay line that includes a plurality of first delay elements connected in series, where each of the first delay elements is adapted to apply a first delay having a first width, and delaying the first signal through the first delay line in order to produce a plurality of first delayed signals at first taps of the first delay elements. The method also includes identifying a first initially-identified tap as a tap of the first taps that corresponds to an initially-identified signal of the first delayed signals, where, of all of the first delayed signals, the initially-identified signal is closest to having a desired alignment, in time, with the first signal. The method also includes identifying a first finally-identified tap by adjusting the first initially-identified tap by a first number of taps, where the first number of taps is related to a first inherent interface circuit delay associated with a first interface circuit, and causing the first interface circuit to pass, to a first output, a first finally-identified signal of the first delayed signals that corresponds with the first finally-identified tap.

An embodiment of the method may further include performing a calibration procedure to determine an edge adjustment value for use during a duty cycle evaluation process. Performing the calibration procedure comprises iteratively performing the steps of adjusting a transition edge of a calibration input signal by a calibration edge adjustment value that initially is zero, in order to produce an edge-adjusted input signal, providing the edge-adjusted input signal to the first delay line as the first signal, and evaluating the first finally-identified signal to determine whether a performance metric is met. When the performance metric is not met, the calibration edge adjustment value is adjusted, and when the performance metric is met, the calibration procedure is discontinued.

While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A signal edge alignment apparatus comprising:
    multiple delay stages connected in series and each having a delay stage input and a delay stage output, wherein each delay stage of the multiple delay stages is characterized by an inherent delay, and each delay stage includes
        a delay line coupled to the delay stage input and adapted to receive an input signal, wherein the delay line includes a plurality of delay elements connected in series, and a plurality of taps associated with the plurality of delay elements, wherein the delay elements are adapted sequentially to apply fixed-width delays to the input signal in order to produce a plurality of delayed versions of the input signal at the taps,
        an interface circuit having an interface circuit input and an interface circuit output, wherein the interface circuit input is coupled with the taps, and the interface circuit is adapted to pass a delayed version of the input signal from one of the taps to the interface circuit output in response to a control signal, and wherein the inherent delay of the delay stage includes an inherent interface circuit delay between the interface circuit input and the interface circuit output, and
        a tap selection circuit coupled with the taps and with the interface circuit, wherein the tap selection circuit is adapted to identify a finally-identified tap of the plurality of taps by determining an initially-identified tap at which a delayed version of the input signal most closely has a desired alignment with the input signal, and by identifying the finally-identified tap in the control signal as a tap that occurs earlier in the delay line than the initially-identified tap in order to compensate for the inherent delay of the delay stage.

2. The signal edge alignment apparatus of claim 1, wherein the multiple delay stages include:
    a first delay stage in which the delay elements each apply a first fixed-width delay to the input signal; and
    a second delay stage coupled to the delay stage output of the first delay stage, and in which the delay elements each apply a second fixed-width delay to the input signal, wherein the second fixed-width delay is smaller than the first fixed-width delay.

3. The signal edge alignment apparatus of claim 2, wherein the second fixed-width delay is less than fifty percent of the first fixed-width delay.

4. The signal edge alignment apparatus of claim 2, wherein the second fixed-width delay is less than ten percent of the first fixed-width delay.

5. The signal edge alignment apparatus of claim 2, wherein the multiple delay stages further include:
    at least one additional delay stage coupled to the delay stage output of the second delay stage.

6. The signal edge alignment apparatus of claim 1, wherein the desired alignment is an alignment of a first type of transition of the input signal with a second type of transition of the delayed version, and wherein the first type of transition is an opposite type from the second type of transition.

7. The signal edge alignment apparatus of claim 1, wherein the inherent delay of the delay stage also includes an inherent start up delay of a next delay stage.

8. The signal edge alignment apparatus of claim 1, wherein the inherent delay of the delay stage also includes an intentional delay adjustment applied in either direction to ensure that a subsequent stage is able to delay an output signal from the interface circuit to a finer alignment resolution than is applied by the delay stage.

9. The signal edge alignment apparatus of claim 1, wherein the interface circuit includes a multiplexer.

10. A signal edge alignment apparatus comprising:
    a first delay line adapted to receive and delay an input signal, wherein the first delay line includes a plurality of first delay elements connected in series and a plurality of first taps of the first delay elements, and wherein each of the first delay elements is adapted to apply a first delay having a first width, and the first delay line is further adapted to produce, at the first taps, a plurality of first delayed signals, which represent delayed versions of the input signal;
    a first interface circuit having a first interface circuit input and a first interface circuit output, wherein the first interface circuit input is coupled with the first taps, and the first interface circuit is adapted to pass a first finally-identified signal present at a first finally-identified tap of the first taps to the first interface circuit output in response to a first control signal, and wherein the first interface circuit is characterized by a first inherent interface circuit delay between the first interface circuit input and the first interface circuit output; and a first tap selection circuit adapted to receive the first delayed signals and the input signal, and to identify a first initially-identified tap as a tap of the first taps that corresponds to a first initially-identified signal of the first delayed signals, wherein, of all of the first delayed signals, the first initially-identified signal is closest to having a desired alignment, in time, with the input signal, and wherein the first tap selection circuit is further adapted to identify the first finally-identified tap by adjusting the first initially-identified tap by a first number of taps, wherein the first number of taps is determined based on the first inherent interface circuit delay, and the first tap selection circuit is further adapted to identify the first finally-identified tap in the first control signal.

11. The signal edge alignment apparatus of claim 10, wherein the desired alignment is an alignment of a first type of transition of the input signal with a second type of transition of the first initially-identified signal, and wherein the first type of transition is an opposite type from the second type of transition.

12. The signal edge alignment apparatus of claim 10, wherein first number of taps is determined based on the first inherent interface circuit delay and an inherent start up delay of a next delay stage.

13. The signal edge alignment apparatus of claim 10, wherein the first number of taps is determined to include an intentional delay adjustment applied in either direction to ensure that a subsequent stage is able to delay an output signal from the first interface circuit to a finer alignment resolution than is applied by the first delay line.

14. The signal edge alignment apparatus of claim 10, further comprising:

a second delay line adapted to receive and delay the first finally-identified signal, wherein the second delay line includes a plurality of second delay elements connected in series and a plurality of second taps of the second delay elements, and wherein each of the second delay elements is adapted to apply a second delay having a second width, and the second delay line is further adapted to produce, at the second taps, a plurality of second delayed signals, which represent delayed versions of the first finally-identified signal;

a second interface circuit having a second interface circuit input and a second interface circuit output, wherein the second interface circuit input is coupled with the second taps, and the second interface circuit is adapted to pass a second finally-identified signal present at a second finally-identified tap of the second taps to the second interface circuit output in response to a second control signal, and wherein the second interface circuit is characterized by a second inherent interface circuit delay between the second interface circuit input and the second interface circuit output; and a second tap selection circuit adapted to receive the second delayed signals and the input signal, and to identify a second initially-identified tap as a tap of the second taps that corresponds to an initially-identified signal of the second delayed signals, wherein, of all of the second delayed signals, the initially-identified signal is closest to having a desired alignment, in time, with the input signal, and wherein the second tap selection circuit is further adapted to identify the second finally-identified tap by adjusting the second initially-identified tap by a second number of taps, wherein the second number of taps is determined based on the second inherent interface circuit delay, and the second tap selection circuit is further adapted to identify the second finally-identified tap in the second control signal.

15. The signal edge alignment apparatus of claim 14, further comprising:

at least one additional delay line coupled to the second interface circuit output;

at least one additional interface circuit coupled with the at least one additional delay line; and at least one additional tap selection circuit coupled with the at least one additional delay line and the at least one additional interface circuit.

16. A method for aligning a first signal with a second signal, the method comprising the steps of:

receiving the first signal at a first delay line that includes a plurality of first delay elements connected in series, wherein each of the first delay elements is adapted to apply a first delay having a first width;

delaying the first signal through the first delay line in order to produce a plurality of first delayed signals at first taps of the first delay elements;

identifying a first initially-identified tap as a tap of the first taps that corresponds to an initially-identified signal of the first delayed signals, wherein, of all of the first delayed signals, the initially-identified signal is closest to having a desired alignment, in time, with the first signal;

identifying a first finally-identified tap by adjusting the first initially-identified tap by a first number of taps, wherein the first number of taps is related to a first inherent interface circuit delay associated with a first interface circuit; and causing the first interface circuit to pass, to a first output, a first finally-identified signal of the first delayed signals that corresponds with the first finally-identified tap.

17. The method of claim 16, further comprising the steps of:

receiving the first finally-identified signal at a second delay line, which includes a plurality of second delay elements connected in series, wherein each of the second delay elements applies a second delay having a second width;

delaying the first finally-identified signal through the second delay line to produce a plurality of second delayed signals at second taps of the second delay elements;

identifying a second initially-identified tap as a tap of the second taps that corresponds to an initially-identified signal of the second delayed signals, wherein, of all of the second delayed signals, the initially-identified signal of the second delayed signals is closest to having the desired alignment, in time, with the first signal;

identifying a second finally-identified tap by adjusting the second initially-identified tap by a second number of taps, wherein the second number of taps is related to a second inherent interface circuit delay associated with a second interface circuit; and causing the second interface circuit to pass, to a second output, a second finally-identified signal of the second delayed signals that corresponds with the second finally-identified tap.

18. The method of claim 17, wherein the second width of the second delay is shorter than the first width of the first delay.

19. The method of claim 17, wherein the first number of taps is also related to an inherent start up delay of the second delay line, and the first number of taps is determined to include an intentional delay adjustment applied to ensure that the second delay line is able to delay an output signal from the first interface circuit to a finer alignment resolution than is applied by the first delay line.

20. The method of claim 16, further comprising performing a calibration procedure to determine an edge adjustment value for use during a duty cycle evaluation process, wherein performing the calibration procedure comprises iteratively performing the steps of:

adjusting a transition edge of a calibration input signal by a calibration edge adjustment value that initially is zero, in order to produce an edge-adjusted input signal;

providing the edge-adjusted input signal to the first delay line as the first signal;

evaluating the first finally-identified signal to determine whether a performance metric is met;

when the performance metric is not met, adjusting the calibration edge adjustment value; and when the performance metric is met, discontinuing the calibration procedure.

21. The method of claim 20, wherein:

the calibration input signal is a reference signal having a pre-specified duty cycle, and the performance metric is that the first finally-identified signal has a target duty cycle, and evaluating the first finally-identified signal includes evaluating the first finally-identified signal to determine whether the first finally-identified signal has the target duty cycle.

22. The method of claim 21, wherein the pre-specified duty cycle equals the target duty cycle.

23. The method of claim 21, wherein the pre-specified duty cycle does not equal the target duty cycle.

* * * * *